(12) United States Patent
Sato et al.

(10) Patent No.: US 6,794,905 B2
(45) Date of Patent: Sep. 21, 2004

(54) CMOS INVERTER

(75) Inventors: Masatoshi Sato, Tochigi-ken (JP); Masayoshi Isobe, Tochigi-ken (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 10/094,824

(22) Filed: Mar. 11, 2002

(65) Prior Publication Data

US 2002/0140458 A1 Oct. 3, 2002

(30) Foreign Application Priority Data

Mar. 28, 2001 (JP) ........................................ 2001-093620

(51) Int. Cl.[7] .......................................... H03K 19/084
(52) U.S. Cl. ............................ 326/108; 326/33; 326/88
(58) Field of Search ........................... 326/32–34, 108, 326/88, 112, 119, 121, 86

(56) References Cited

U.S. PATENT DOCUMENTS 4,794,283 A * 12/1988 Allen et al. .................... 326/68
6,072,353 A * 6/2000 Matsuzawa ................. 327/390
6,351,138 B1 * 2/2002 Wong ........................... 326/30

* cited by examiner

*Primary Examiner*—Anh Q. Than
(74) *Attorney, Agent, or Firm*—Jordan and Hamburg LLP

(57) ABSTRACT

A CMOS inverter capable of operating at low voltages is provided. The gate of a p-channel MOS transistor and the gate of an n-channel MOS transistor are AC coupled to an input terminal via first and second capacitors, respectively. Signals whose amplitude centers are optimized according to the threshold voltages of the p- and n-channel MOS transistors by bias voltages from first and second variable voltage sources, respectively, are supplied to the gates of these MOS transistors. In consequence, the CMOS inverter can operate at high speeds at low power supply voltages without being affected by the threshold voltages.

7 Claims, 4 Drawing Sheets

21 STAGES

RELATED ART

US 6,794,905 B2

CMOS INVERTER

BACKGROUND OF THE INVENTION

1. Field of the Invention

The present invention relates to a CMOS inverter and, more particularly, to a CMOS inverter capable of operating at high speeds at low power supply voltages.

2. Description of the Related Art

A CMOS circuit of related art uses a CMOS inverter as shown in FIG. 5. In this CMOS inverter shown in FIG. 5, the source of a p-channel MOS transistor p1 is connected with a power supply terminal VDD of 3 V, for example. The source of an n-channel MOS transistor n1 is connected with a power supply terminal VSS that is at ground potential of 0 V. Their gates are connected with an input terminal in. Their drains are connected with an output terminal out. In this way, the circuit is configured.

In the CMOS inverter shown in FIG. 5, the threshold voltage Vth of each transistor is an impediment to lower supply voltage operation. In particular, as the power supply voltage drops, the voltage difference between the threshold voltage Vth and an input signal applied to the gate decreases, thus reducing the drain current of each MOS transistor. This reduces the operating speed of the CMOS inverter. In the worst case, it cannot be operated.

It is also contemplated to adjust the threshold voltage Vth of the MOS transistor by the process. However, the process is specialized and so the process sequence is complicated. As a result, the obtained CMOS inverter is more disadvantageous than those fabricated by normal CMOS processes in terms of reliability and cost.

SUMMARY OF THE INVENTION

Accordingly, it is an object of the present invention to provide a CMOS inverter that can be easily realized by a manufacturing process and can be operated at lower voltages.

A CMOS inverter of the present invention comprises: a p-channel MOS transistor having a source connected with a first power supply terminal; an n-channel MOS transistor having a source connected with a second power supply terminal that is at a lower potential than the first power supply terminal; an output terminal connected with the junction of the drain of the p-channel MOS transistor and the drain of the n-channel MOS transistor; a first capacitor having one terminal connected with the gate of the p-channel MOS transistor and the other terminal connected with an input terminal; a second capacitor having one terminal connected with the gate of the n-channel MOS transistor and the other terminal connected with the input terminal; a first voltage source for producing a first bias voltage applied to the gate of the p-channel MOS transistor; and a second voltage source for producing a second bias voltage applied to the gate of the n-channel MOS transistor.

Another CMOS inverter of the invention comprises: a first p-channel MOS transistor having a source connected with a first power supply terminal; a first n-channel MOS transistor having a source connected with a second power supply terminal that is at a lower potential than the first power supply terminal; an output terminal connected with the junction of the drain of the first p-channel MOS transistor and the drain of the first n-channel MOS transistor; a first capacitor having one terminal connected with the gate of the first p-channel MOS transistor and the other terminal connected with an input terminal; a second capacitor having one terminal connected with the gate of the first n-channel MOS transistor and the other terminal connected with the input terminal; a first resistor having one terminal connected with the gate of the first p-channel MOS transistor and the other terminal connected with the junction of the gate and drain of the second p-channel MOS transistor; a second resistor having one terminal connected with the gate of the first n-channel MOS transistor and the other terminal connected with the junction of the gate and drain of the second n-channel MOS transistor; a third resistor connected between the drain of the second p-channel MOS transistor and the second power supply terminal; a fourth resistor connected between the drain of the second n-channel MOS transistor and the first power supply terminal; a third p-channel MOS transistor having its gate and drain connected together, the source of the third p-channel MOS transistor being connected with the first power supply terminal, the drain of the third p-channel MOS transistor being connected with the source of the second p-channel MOS transistor; and a third n-channel MOS transistor having its gate and drain connected together, the source of the third n-channel MOS transistor being connected with the second power supply terminal, the drain of the third n-channel MOS transistor being connected with the source of the second n-channel MOS transistor.

DESCRIPTION OF THE PREFERRED EMBODIMENTS

Embodiments of the present invention are hereinafter described with reference to the accompanying drawings.

Figure 1:
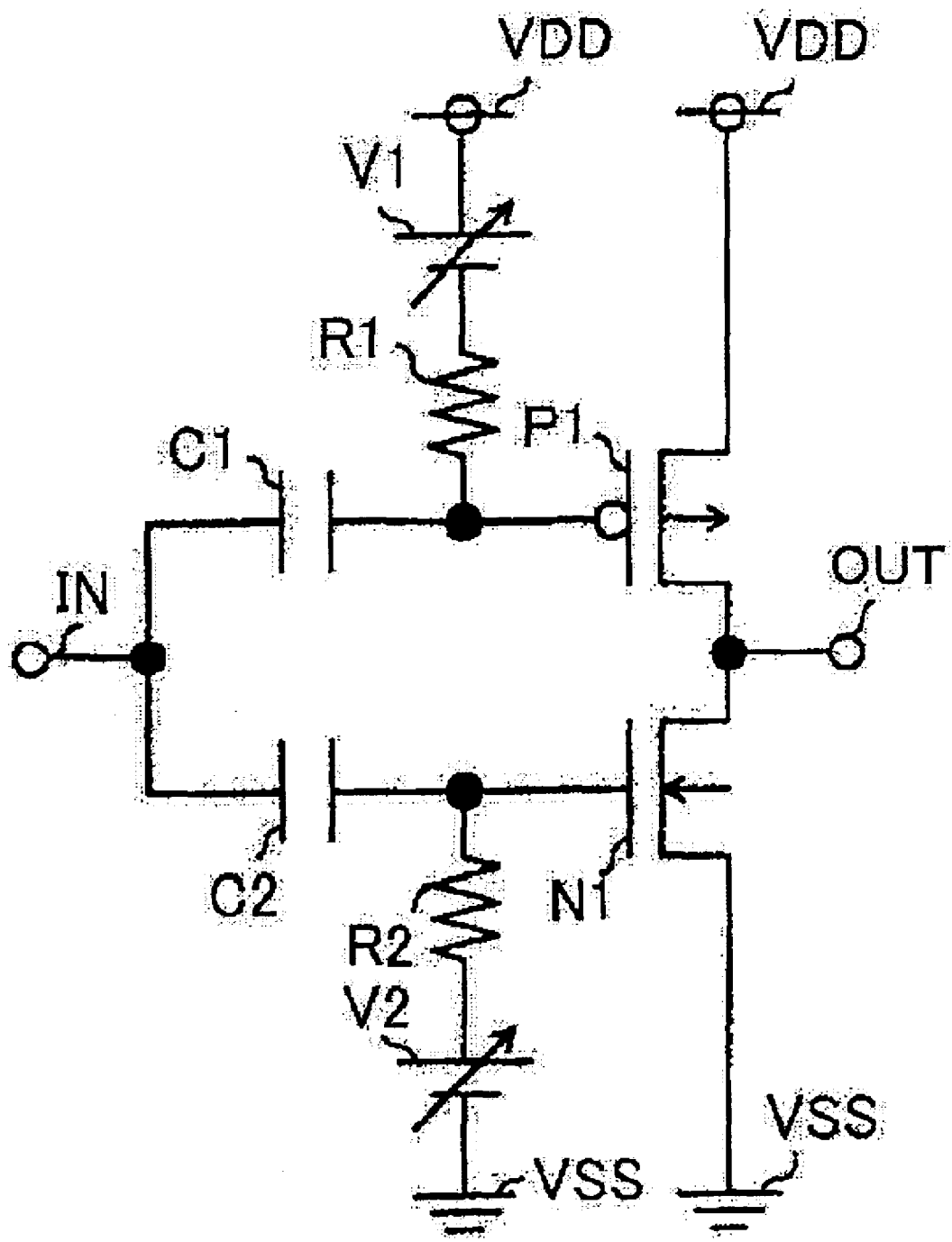
FIG. 1 is an electric circuit diagram showing the configuration of a CMOS inverter in accordance with one embodiment of the present invention.

The configuration of a CMOS inverter in accordance with one embodiment of the invention is first described by referring to FIG. 1. In the present embodiment, the source of a first p-channel MOS transistor P1 is connected with a power supply terminal VDD of 3 V, for example, that is at a higher potential side. The source of a first n-channel MOS transistor N1 is connected with a power supply terminal VSS of 0 V, for example, that is at a lower potential side. The drains of these transistors P1 and N1 are connected with an output terminal OUT. The gates of the first p-channel MOS transistor P1 and first n-channel MOS transistor N1 are AC coupled to an input terminal IN via a first capacitor C1 and a second capacitor C2, respectively. The gates are also connected with a first variable voltage source V1 and a second variable voltage source V2, respectively, via a first resistor R1 and a second resistor R2, respectively. The first variable voltage source V1 and the second variable voltage source V2 produce first and second bias voltages, respectively, whose amplitude centers are at given potentials according to charging and discharging of the first and second capacitors C1 and C2, respectively. Thus, the first and second bias voltages from the first and second variable voltage sources V1 and V2, respectively, are applied to the gates of the first p-channel MOS transistor P1 and the first n-channel MOS transistor N1, respectively. Consequently, the apparent threshold voltage Vth of the first p-channel MOS transistor P1 and the first n-channel MOS transistor N1 as viewed from the input terminal side decreases. In particular, signals whose amplitude centers are optimized according to the threshold potentials (in other words, threshold voltages) of the first p-channel MOS transistor P1 and first n-channel MOS transistor N1, respectively, are applied to their gates. Consequently, the configuration of the present embodiment can be implemented sufficiently as an inverter, even where the power supply voltage cannot be made sufficiently greater than the threshold voltages of the p- and n-channel MOS transistors.

Figure 2:
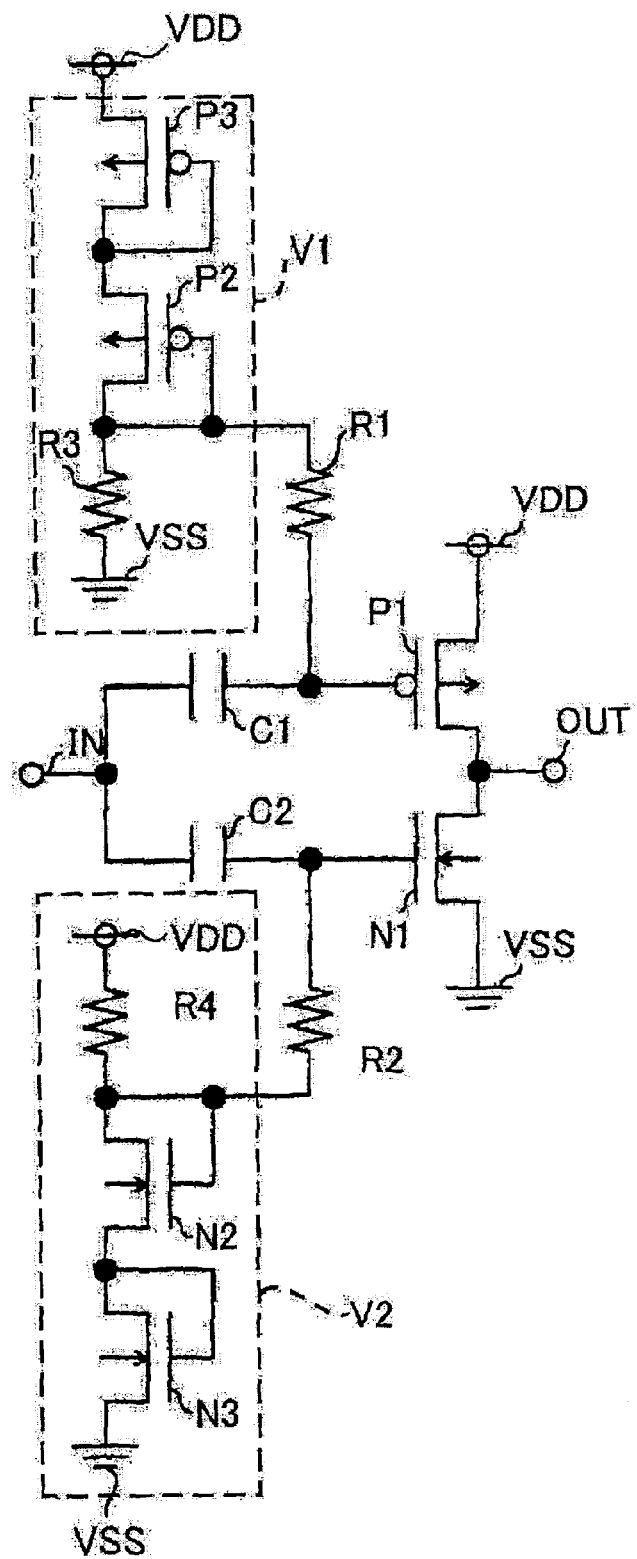
FIG. 2 is an electric circuit diagram including specific configurations of first and second variable voltage sources in the CMOS inverter of FIG. 1.

The configuration of the present embodiment including specific structures of the first and second variable voltage sources V1 and V2, respectively, is described next by referring to FIG. 2, in which those components identical with their counterparts of FIG. 1 are indicated by the same symbols as in FIG. 1. One end of the first resistor R1 is connected with a third resistor R3 and with the gate and drain of a second p-channel MOS transistor P2. One end of the third resistor R3 is connected with the power supply terminal VSS. The source of the second p-channel MOS transistor P2 is connected with the gate and drain of a third p-channel MOS transistor P3. The source of the third p-channel MOS transistor P3 is connected with the power supply terminal VDD. The second p-channel MOS transistor P2, the third p-channel MOS transistor P3, and the third resistor R3 together form the first variable voltage source V1. The first bias voltage is obtained from the gate and drain of the second p-channel MOS transistor P2.

One end of the second resistor R2 is connected with a fourth resistor R4 and with the gate and drain of the second n-channel MOS transistor N2. One end of the fourth resistor R4 is connected with the power supply terminal VDD. The source of the second n-channel MOS transistor N2 is connected with the gate and drain of a third n-channel MOS transistor N3. The source of the third n-channel MOS transistor N3 is connected with the power supply terminal VSS. The second n-channel MOS transistor N2, the third n-channel MOS transistor N3, and the fourth resistor R4 together constitute the second variable voltage source V2. The second bias voltage is obtained from the gate and drain of the second n-channel MOS transistor N2.

The operation of the present embodiment is next described. Let Vm be the potential midway between the potentials when the input signal is H and L, respectively. Also, it is assumed that the operating frequency is higher than the time constant of the AC coupling between the input terminal IN and the p-channel MOS transistor P1 through the first capacitor C1 and the time constant of the AC coupling between the input terminal IN and the n-channel MOS transistor N1 through the second capacitor C2. Let Vp be the potential at the gate and drain of the second p-channel MOS transistor P2. Let Vn be the potential at the gate and drain of the second n-channel MOS transistor N2. A signal whose amplitude center is Vp is applied to the gate of the first p-channel MOS transistor P1 and a signal whose amplitude center is Vn is applied to the gate of the first n-channel MOS transistor N1 by setting the potential Vp to less than Vm and setting the potential Vn to greater than Vm.

As a result, a signal of a potential lower than the input signal is applied to the gate of the first p-channel MOS transistor P1, and a signal of a potential higher than the input signal is applied to the gate of the first n-channel MOS transistor N1. Hence the inverter can be operated almost regardless of the threshold voltages Vth of the MOS transistors, if the power supply voltage between the power supply terminals VDD and VSS decreases, by appropriately selecting Vp and Vn, or the first and second bias voltages. The inverter can be operated at high speeds even at low voltages.

Figure 3:
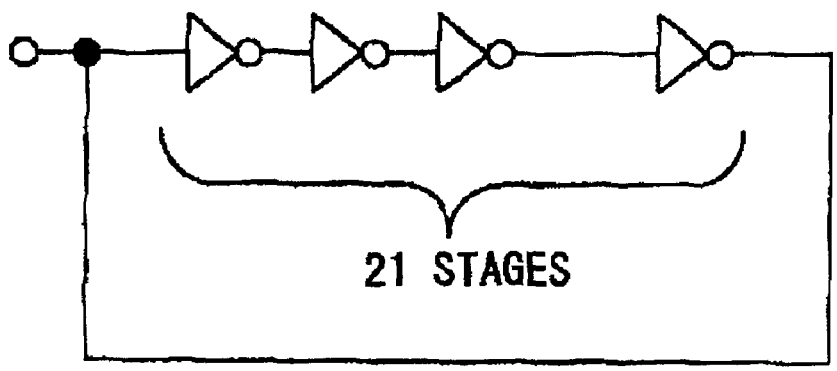
FIG. 3 is an electric circuit diagram showing the configuration of a ring oscillator, illustrating the operation of the configuration of FIG. 1.
Figure 4:
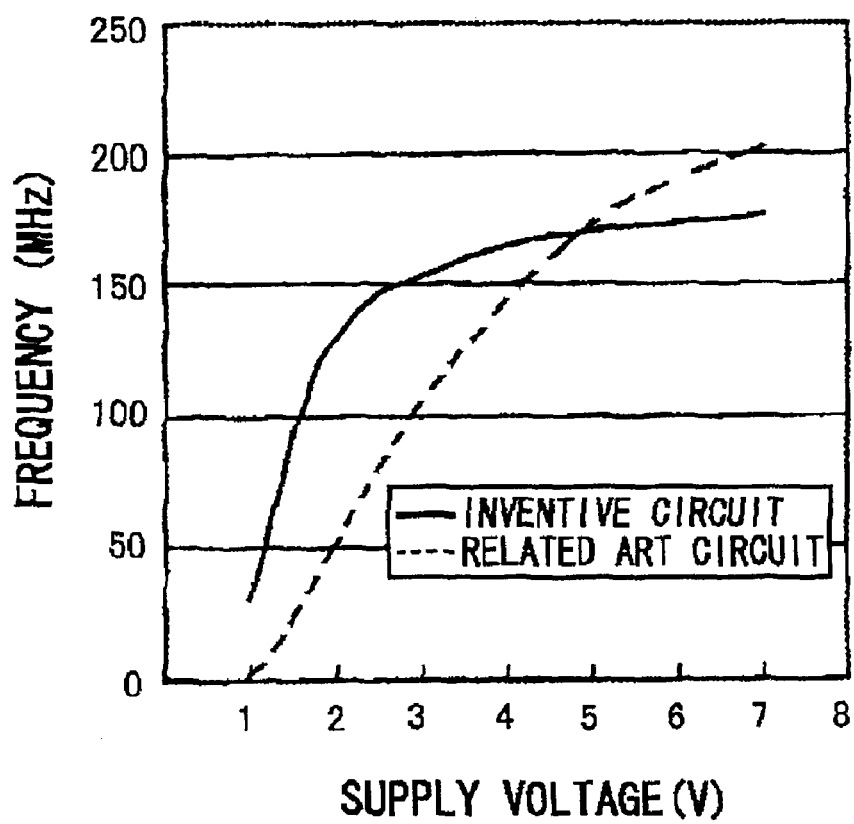
FIG. 4 is an operating frequency-supply voltage characteristic diagram of ring oscillators of FIG. 3, the oscillators being built using a CMOS inverter of the invention and a CMOS inverter of related art, respectively.
Figure 5:
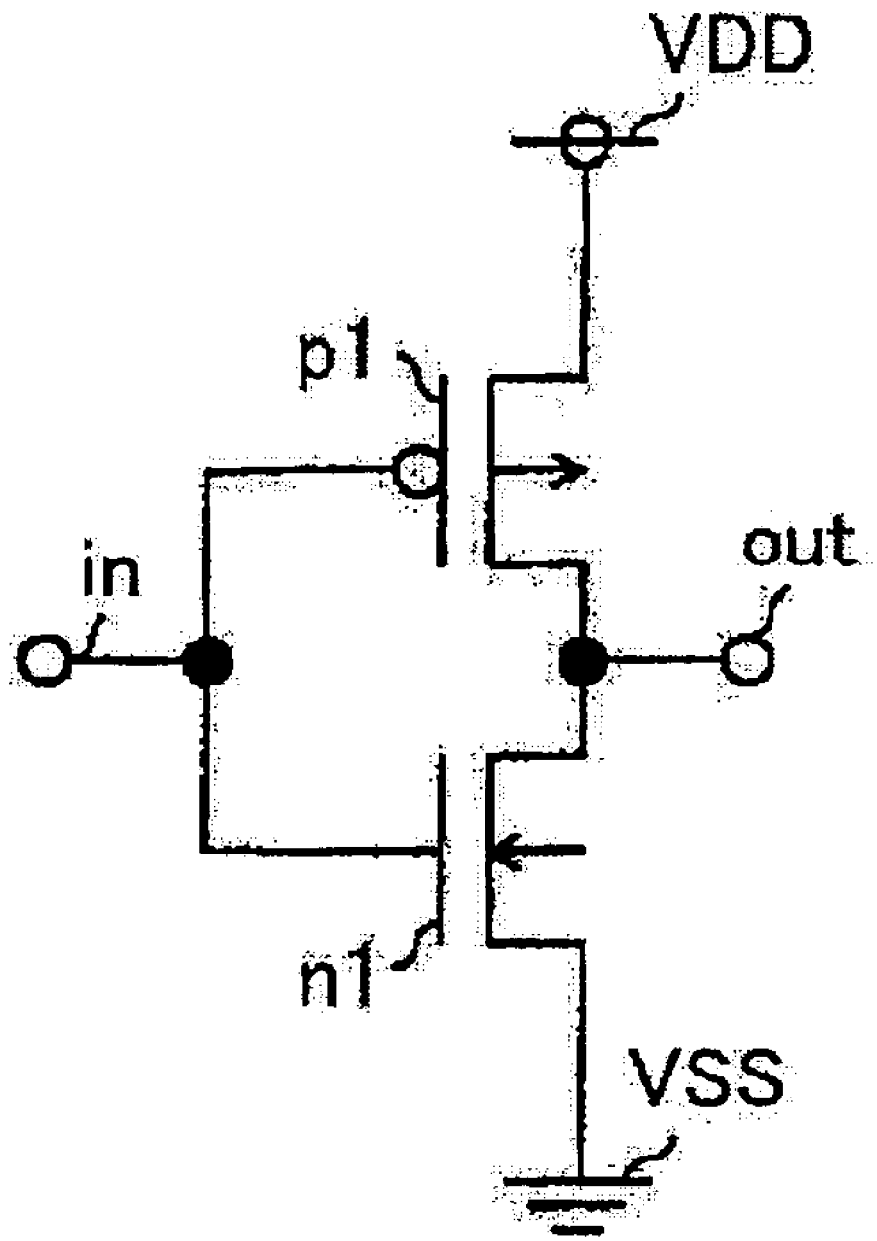
FIG. 5 is an electric circuit diagram showing the configuration of a CMOS inverter of related art.

Ring oscillators as shown in FIG. 3 were built using the CMOS inverter according to the present embodiment and a CMOS inverter of related art, respectively, and the oscillators were set into oscillation. As a result, frequency-supply voltage characteristics shown in FIG. 4 were obtained. As shown in FIG. 4, the CMOS inverter of the present embodiment produced higher operating frequencies at low operating voltages than are produced by the related art CMOS inverter.

CMOS inverters of the above embodiment can be integrated by ordinary CMOS processes and so they are more advantageous in terms of reliability and cost than CMOS inverters whose threshold voltages themselves are adjusted by a manufacturing process because special process steps for adjusting threshold voltages are not necessary, unlike the case in which the process involves adjusting the threshold voltages themselves; otherwise, the process sequence would be complicated or the number of process steps would be increased.

Furthermore, in the embodiment described above, in order to apply first and second bias voltages to the gates of the first p-channel MOS transistor P1 and the first n-channel MOS transistor N1, respectively, the first and second variable voltage sources V1 and V2 connected with the power supply terminals VDD and VSS, respectively, are connected with the gates of the first p-channel MOS transistor P1 and the first n-channel MOS transistor N1 via the resistors R1 and R2, respectively. The invention is not limited to this configuration. For instance, a DC voltage source may be provided between the first capacitor C1 and the gate of the first p-channel MOS transistor P1 to apply a DC voltage, and a DC voltage source may be provided between the second capacitor C2 and the gate of the first n-channel MOS transistor N1 to apply a DC voltage, for applying bias voltages.

According to a CMOS inverter of the present invention, the drain of a p-channel MOS transistor and the drain of an n-channel MOS transistor are connected and used as an output terminal. The gate of the p-channel MOS transistor and the gate of the n-channel MOS transistor are AC coupled to an input terminal via first and second capacitors, respectively. First and second bias voltages are applied to the gates of the p-channel MOS transistor and n-channel MOS transistor, respectively. Therefore, signals whose amplitude centers are optimized according to the threshold voltages of the p- and n-channel MOS transistors can be applied to the gates of these MOS transistors by appropriately setting the first and second bias voltages. The inverter can be operated almost regardless of the threshold voltages of the MOS transistors even if the power supply voltage drops. High-speed operation at low power supply voltages is enabled.

In addition, CMOS inverters of the invention can be integrated by normal CMOS processes. Special process steps for adjusting the threshold voltages are not necessary, unlike the case in which the process involves adjusting the threshold voltages themselves; otherwise, the process sequence would be complicated or the number of process steps would be increased. As a consequence, a CMOS inverter operating at lower power supply voltages can be easily obtained by a manufacturing process.

What is claimed is:

1. A CMOS inverter comprising:
   a first p-channel MOS transistor having a source connected with a first power supply terminal;
   a first n-channel MOS transistor having a source connected with a second power supply terminal that is at a lower potential than said first power supply terminal;
   an output terminal connected with a junction of a drain of said first p-channel MOS transistor and a drain of said first n-channel MOS transistor;
   an input terminal;
   a first capacitor having one terminal connected with a gate of said first p-channel MOS transistor and another terminal connected with said input terminal;
   a second capacitor having one terminal connected with a gate of said first n-channel MOS transistor and another terminal connected with said input terminal;
   a second p-channel MOS transistor;
   a first resistor having one terminal connected with a gate of said first p-channel MOS transistor and another terminal connected with a junction of a gate and a drain of said second p-channel MOS transistor;
   a second n-channel MOS transistor;
   a second resistor having one terminal connected with the gate of said first n-channel MOS transistor and another terminal connected with a junction of a gate and a drain of said second n-channel MOS transistor;
   a third resistor connected between a drain of said second p-channel MOS transistor and said second power supply terminal;
   a fourth resistor connected between a drain of said second n-channel MOS transistor and said first power supply terminal;
   a third p-channel MOS transistor having its gate and drain connected together, said third p-channel MOS transistor having a source connected with said first power supply terminal, said drain of said third p-channel MOS transistor being connected with the source of said second p-channel MOS transistor; and
   a third n-channel MOS transistor having its gate and drain connected together, said third n-channel MOS transistor having a source connected with said second power supply terminal, said drain of said third n-channel MOS transistor being connected with the source of said second n-channel MOS transistor.

2. A CMOS comprising:
   a first p-channel MOS transistor having a source connected with a first power supply terminal;
   a first n-channel MOS transistor having a source connected with a second power supply terminal that is at a lower potential than said first power supply terminal;
   an output terminal connected with a junction of a drain of said first p-channel MOS transistor and a drain of said first n-channel MOS transistor;
   an input terminal;
   a first capacitor having one terminal connected with a gate of said first p-channel MOS transistor and another terminal connected with said input terminal;
   a second capacitor having one terminal connected with a gate of said first n-channel MOS transistor and another terminal connected with said input terminal;
   a first voltage source for producing a first bias voltage applied to said gate of said first p-channel MOS transistor; and
   a second voltage source for producing a second bias voltage applied to said gate of said first n-channel MOS transistor;
   said first voltage source comprising a second p-channel MOS transistor arranged to produce said first bias voltage which is optimized according to a threshold voltage of said first p-channel MOS transistor, based on a potential of said first power supply terminal and uses a threshold voltage of said second p-channel MOS transistor;
   said second voltage source comprising a second n-channel MOS transistor arranged to produce said second bias voltage which is optimized according to a threshold voltage of said first n-channel MOS transistor, based on a potential of said second power supply terminal, and uses a threshold voltage of said second n-channel MOS transistor;
   a first resistor having one terminal connected with a gate of said first p-channel MOS transistor and another terminal connected with a junction of a gate and a drain of said second p-channel MOS transistor; and
   a second resistor connected between a drain of said second p-channel MOS transistor and said second power supply terminal.

3. The CMOS inverter of claim 2, further comprising:
   a third p-channel MOS transistor having its gate and drain connected together, said third p-channel MOS transistor having a source connected with said first power supply terminal, said drain of said third p-channel MOS transistor being connected with the source of said second p-channel MOS transistor.

4. A CMOS inverter comprising:
   a first p-channel MOS transistor having a source connected with a first power supply terminal;
   a first n-channel MOS transistor having a source connected with a second power supply terminal that is at a lower potential than said first power supply terminal;
   an output terminal connected with a junction of a drain of said first p-channel MOS transistor and a drain of said first n-channel MOS transistor;
   an input terminal;
   a first capacitor having one terminal connected with a gate of said first p-channel MOS transistor and another terminal connected with said input terminal;
   a second capacitor having one terminal connected with a gate of said first n-channel MOS transistor and another terminal connected with said input terminal;
   a first voltage source for producing a first bias voltage applied to said gate of said first p-channel MOS transistor; and
   a second voltage source for producing a second bias voltage applied to said gate of said first n-channel MOS transistor;
   said first voltage source comprising a second p-channel MOS transistor arranged to produce said first bias voltage which is optimized according to a threshold voltage of said first p-channel MOS transistor, based on a potential of said first power supply terminal and uses a threshold voltage of said second p-channel MOS transistor;
   said second voltage source comprising a second n-channel MOS transistor arranged to produce said second bias voltage which is optimized according to a threshold voltage of said first n-channel MOS transistor, based on a potential of said second power supply terminal, and uses a threshold voltage of said second n-channel MOS transistor;

a first resistor having one terminal connected with the gate of said first n-channel MOS transistor and another terminal connected with a junction of a gate and a drain of said second n-channel MOS transistor; and a second resistor connected between a drain of said second n-channel MOS transistor and said first power supply terminal.

5. The CMOS inverter of claim 4, further comprising:

a third n-channel MOS transistor having its gate and drain connected together, said third n-channel MOS transistor having a source connected with said second power supply terminal, said drain of said third n-channel MOS transistor being connected with the source of said second n-channel MOS transistor.

6. A CMOS inverter comprising:

a first p-channel MOS transistor having a source connected with a first power supply terminal;

a first n-channel MOS transistor having a source connected with a second power supply terminal that is at lower potential than said first power supply terminal;

an output terminal connected with a junction of drain of said first p-channel MOS transistor and a drain of said first n-channel MOS transistor;

a input terminal;

a first capacitor having one terminal connected with a gate of said first p-channel MOS transistor and another terminal connected with said input terminal;

a second capacitor having one terminal connected with a gate of said first n-channel MOS transistor and another terminal connected with said input terminal;

a first voltage source for producing a first bias voltage applied to said gate of said first p-channel MOS transistor; and a second voltage source for producing a second bias voltage applied to said gate of said first n-channel MOS transistor:

said first voltage source comprising a second p-channel MOS transistor arranged to produce said first bias voltage which is optimized according to a threshold voltage of said first p-channel MOS transistor, based on a potential of said first power supply terminal and uses a threshold voltage of said second p-channel MOS transistor;

said second voltage source comprising a second n-channel MOS transistor arranged to produce said second bias voltage which is optimized according to a threshold voltage of said first n-channel MOS transistor, based on a potential of said second power supply terminal, and uses a threshold voltage of said second n-channel MOS transistor;

a first resistor having one terminal connected with a gate of said first p-channel MOS transistor and another terminal connected with a junction of a gate and a drain of said second p-channel MOS transistor;

a second resistor having one terminal connected with the gate of said first n-channel MOS transistor and another terminal connected with a junction of a gate and a drain of said second n-channel MOS transistor;

a third resistor connected between a drain of said second p-channel MOS transistor and said second power supply terminal; and a fourth resistor connected between a drain of said second n-channel MOS transistor and said first power supply terminal.

7. The CMOS inverter of claim 6, further comprising:

a third p-channel MOS transistor having its gate and drain connected together, said third p-channel MOS transistor having a source connected with said first power supply terminal, said drain of said third p-channel MOS transistor being connected with the source of said second p-channel MOS transistor; and a third n-channel MOS transistor having its gate and drain connected together, said third n-channel MOS transistor having a source connected with said second power supply terminal, said drain of said third n-channel MOS transistor being connected with the source of said second n-channel MOS transistor.

* * * * *